US007161781B2

(12) United States Patent
van Engelen et al.

(10) Patent No.: US 7,161,781 B2
(45) Date of Patent: Jan. 9, 2007

(54) SIGNAL DRIVING SYSTEM

(75) Inventors: Josephus A. E. P. van Engelen, Aliso Viejo, CA (US); Yee Ling Cheung, Irvine, CA (US); Mark J Chambers, Mission Viejo, CA (US); Darwin Cheung, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 454 days.

(21) Appl. No.: 10/660,662

(22) Filed: Sep. 12, 2003

(65) Prior Publication Data

US 2005/0057871 A1    Mar. 17, 2005

(51) Int. Cl.
*H02H 3/42*    (2006.01)

(52) U.S. Cl. .......................................... 361/88; 361/87
(58) Field of Classification Search ................. 361/86, 361/87, 88; 326/82; 327/108, 109, 111
See application file for complete search history.

(56) References Cited

U.S. PATENT DOCUMENTS

| 5,889,431 | A  | * | 3/1999 | Csanky ........................ 327/543 |
| 6,337,884 | B1 | * | 1/2002 | Cao et al. .................... 375/257 |
| 6,710,603 | B1 | * | 3/2004 | Gregorius ................... 324/522 |
| 2002/0017920 | A1 | * | 2/2002 | Bridgewater, Jr. ............ 326/82 |

OTHER PUBLICATIONS

*1394*, Agere Systems Inc., from http://www.agere/cpm/entnet/1394.html, 2 pages, printed Mar. 17, 2006 (Copyright 2002-2006).
*1394*Philips, from http://www.semiconductors.philips.com/products.connectivity-/1394/index.html, 2 pages, printed Mar. 17, 2006 (Copyright 2004-2005).
*1394 Integrated Devices Product Home from Texas Instruments*, Texas Instruments Inc.., from http://focus.ti.com/paramsearch/docs/parametricsearch.tsp!family=analog&family-Id=547 &uiTemplateId=NODE STRY PGE T¶mCriteria=no., 2 pages, printed Mar. 17, 2006 (Copyright 1995-2005).
*FW803 PHY IEEE\* 1395A Three-Cable Transceiver/Arbiter Device*, Data Sheet, Rev. 3, Agere Systems Inc., 24 pages (Jun. 2001).
*PDI1394P21 3-port 400 Mbps physical layer interface*, Data Sheet, Philips, 40 pages (Sep. 6, 2001).
*PDI1394P23 2-port/1-port 400 Mbps physical layer interface*, Data Sheet, Philips, 42 pages (Sep. 6, 2001).
*TSB41AB3 IEEE 139a-2000 Three-Port Cable Transceiver/Arbiter*, Texas Instruments Inc., 50 pages (Copyright 2001).
*TSB81A3 IEEE 1394b Three-Port Cable Transceiver/Arbiter*, Texas Instruments Inc., 57 pages (Copyright 2002).

\* cited by examiner

*Primary Examiner*—Stephen W. Jackson
*Assistant Examiner*—Danny Nguyen
(74) *Attorney, Agent, or Firm*—Sterne, Kessler, Goldstein & Fox P.L.L.C.

(57) ABSTRACT

A signal driving system generates an output swinging between a first power supply (e.g., about 1.2 Volts), powering first and second drivers, and a second power supply (e.g., about 3.3 Volts), powering a first current mirror. The second power supply is generated external to the signal driving system and is used to allow for a desired common-mode differential output signal range. However, the second power supply produces voltage at a level above a rating of the devices in the signal driving system. Therefore, protection devices are used to protect the elements of the signal driving system from the second power supply. Accordingly, through use of the signal driving system of the present invention, a high voltage current mode driver can operate in a low voltage process without damaging the devices in the signal driving system.

32 Claims, 4 Drawing Sheets

SIGNAL DRIVING SYSTEM

BACKGROUND OF THE INVENTION

1. Field of the Invention

The present invention is related to signal drivers.

2. Background Art

Signal driving systems on chips can be used to drive a signal (e.g., a current) through an internal or external termination (e.g., an impedance) in order to create a single-ended or differential output signal (e.g., a single-ended or differential voltage). Typically, a process is rated for a certain maximum supply voltage. Usually, a supply voltage is chosen that is smaller than a maximum allowed process voltage of the signal driving system (e.g., maximum breakdown voltage of devices in the signal driving system). However, some applications specifications for the signal driving system require the signal driving system to operate from a supply voltage that may be higher than the process rated voltage. For example, producing a differential output signal with a signal driving system may not possible when the maximum supply voltage is equal to or less than the common-mode output voltage that is determined by external sources.

For example, in some IEEE 1394 drivers, a process can be rated 2.5V, while the externally applied common-mode voltage at the output of the drivers can be as high as 2.515 Volts. In this case the signal driving system is unable to drive the differential output signal.

One way to overcome this problem is to choose a supply voltage above the common-mode voltage (e.g., about 3.3V for the above-mentioned IEEE 1394 driver). However, this could violate the process rating, which may damage the devices in the signal driving system. Damage to the devices in the signal driving system can result in failure of the signal driving system, costly repair and/or replacement costs, and downtime to perform the same.

Therefore, what is needed is a system and method that protect a signal driving system from being damaged by a power source having a value greater than a process rating.

BRIEF SUMMARY OF THE INVENTION

The present invention provides a signal driving system, which includes the following elements. A first driver is coupled to a first voltage supply. The first driver is configured to push a signal through an output node via a current mirror. The current mirror is coupled to a second voltage supply. The second voltage supply has a higher voltage value than the first voltage supply. A first protection device is coupled between the first driver and the current mirror. A second protection device is coupled between the current mirror and the output node. A second current mirror is coupled to ground. A third protection device is coupled between the output node and the second current mirror. A second driver is coupled to a third voltage supply (which can be equal to the first voltage supply) and to the second current mirror. The second driver is configured to pull a signal from the output node through a current mirror to ground.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
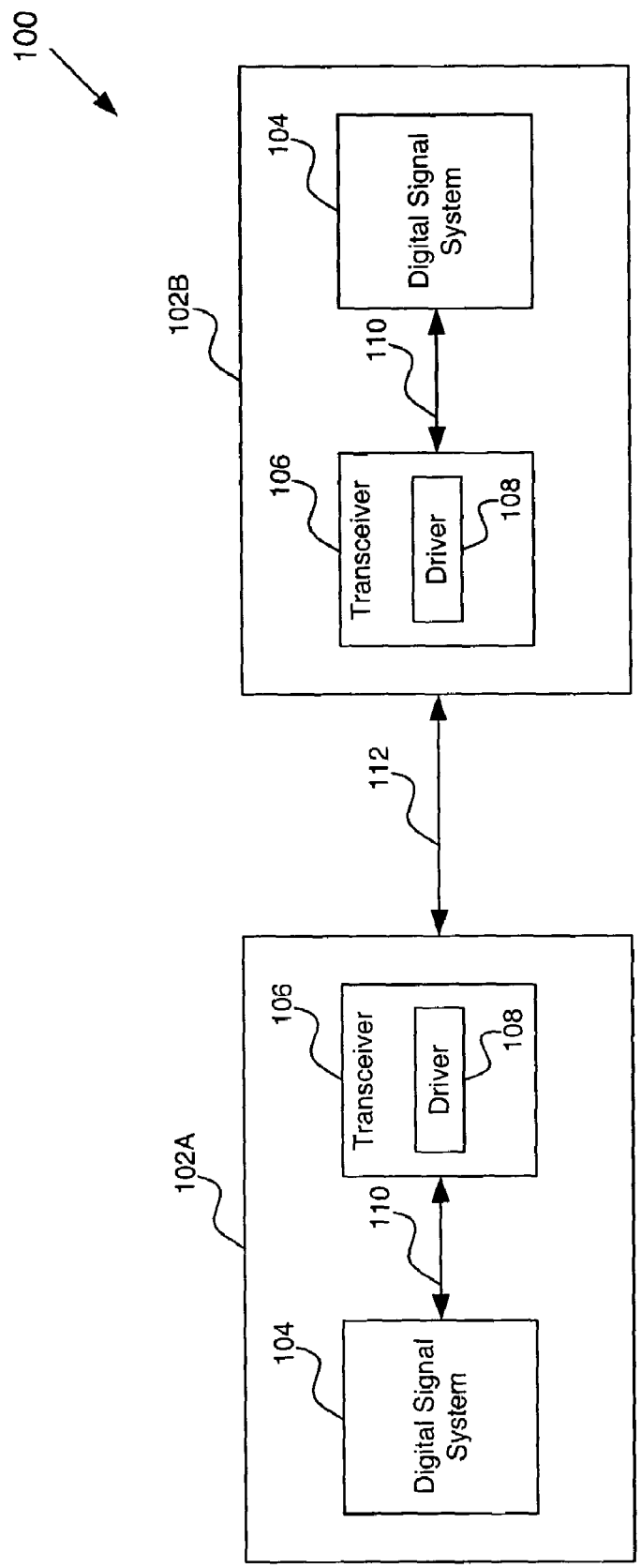
FIG. 1 shows a block diagram of chip-to-chip communications scheme using a signal driver system.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Embodiments of the present invention provide a signal driving system powered by a first power supply (e.g., about 1.2 Volts), powering first and second drivers, and a second power supply (e.g., about 3.3 Volts), powering a first current mirror. The second power supply produces a supply voltage at a level above a rating of the devices in the signal driving system. Therefore, protection devices are used to protect the elements of the signal driving system from the second power supply. Accordingly, through use of the signal driving system of the present invention, a high voltage current mode driver can operate in a low voltage process without damaging the devices in the signal driving system.

Chip-to-Chip Communications

FIG. 1 is a block diagram showing a system 100 having a chip 102A communicating with a chip 102B. In one embodiment, chips 102A and 102B can be IEEE 1394 devices that send and receive high speed (e.g., Megabit per second) serial data signals. Each chip 102 includes at least a digital signal system 104 (e.g., a PHY digital core) and a transceiver 106 (e.g., in a PHY analog device). Each transceiver 106 includes at least a signal driving system 108 (e.g., a driver).

For example, digital signals 110 from digital signal system 104 (or one or more other intermediate digital signal devices, not shown) can be converted to (differential) analog output signals 112 using signal driving system 108. Signal 112 can be an IEEE 1394 high speed serial data signal.

Overall Signal Driving System

Figure 2:
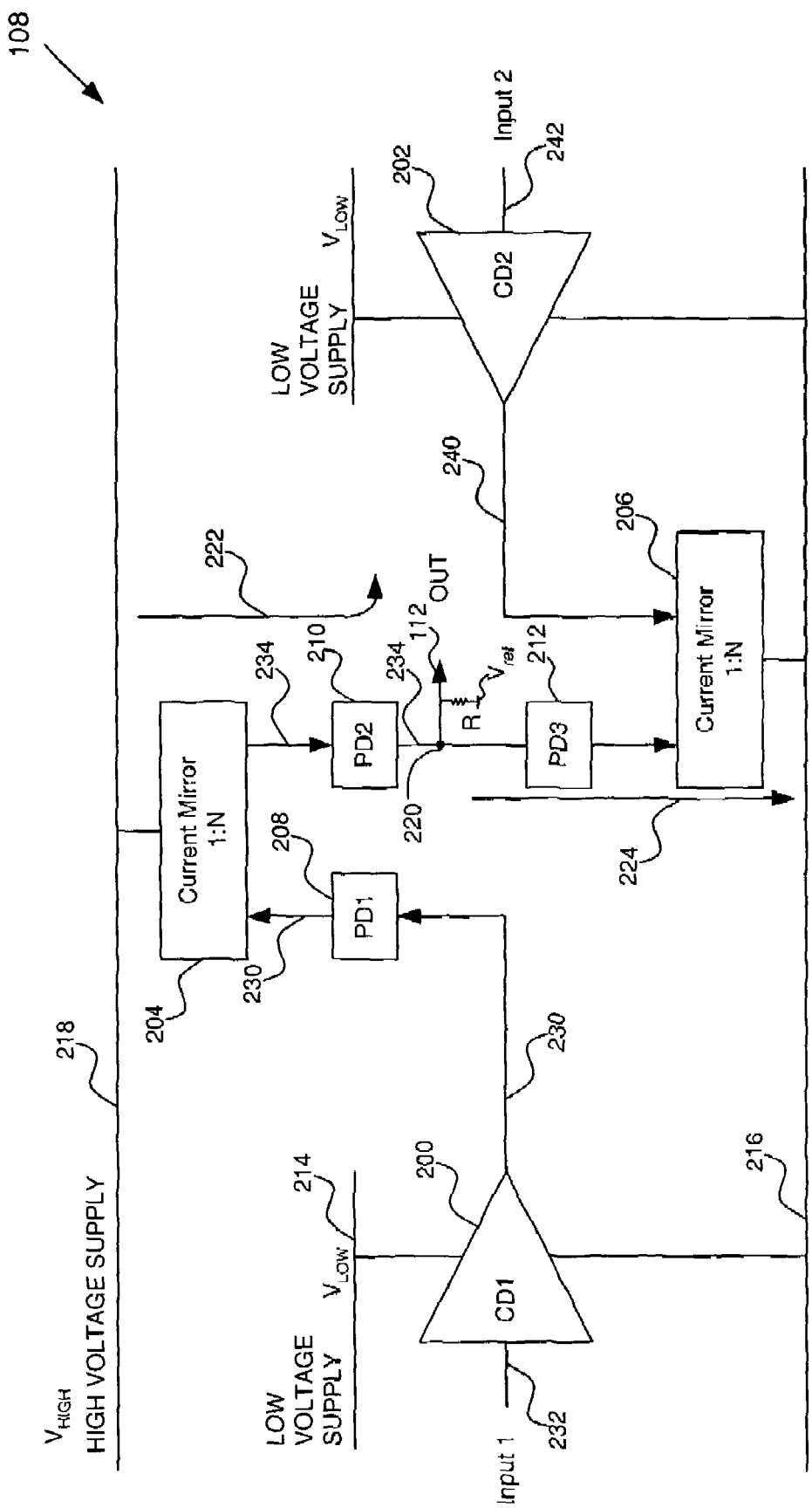
FIG. 2 is a block diagram of a signal driving system.

FIG. 2 shows a block diagram of a signal driving system 108.

Although signal driving system 108 in FIG. 2 is shown as a single-ended signal current mode driver, signal driving system 108 can also be a differential current mode driver if all signals are differential signals. However, it is to be appreciated that all signals can be single-ended, all signals can be differential, or some signals can be single-ended and others can be differential. All these variations are contemplated within the scope of the present invention.

Signal driving system 108 includes first and second drivers 200 and 202 (e.g., current drivers), first and second current mirrors 204 and 206, and first, second and third protection devices 208, 210, and 212.

First and second drivers 200 and 202 are coupled between a first power supply 214 (e.g., a low voltage supply $V_{Low}$, which can be about 1.2 Volts or about 2.5 Volts) and ground (GND) 216. In an alternative embodiment, drivers 200 and 202 can be coupled to different power supplies having the same or different values, without departing from the scope of the present invention.

Current mirrors 204 and 206 can have current mirror ratios of 1:N (N being any positive integer). First current mirror 204 is coupled to a second power supply 218 (e.g., a high voltage supply $V_{High}$, which can be about 3.3 Volts). Second current mirror 206 is coupled to ground 216.

In one embodiment, a resistor R can be coupled between output node 220 and a fixed reference voltage Vref, which has a value between $V_{High}$ and ground 216. When a current flows out node 220 and across resistor R, output voltage 112 is generated, the use of which will be described in more detail below.

First, second, and third protection devices 208, 210, and 212 are used to protect the current mirrors 204 and 206 and drivers 200 and 202 to ensure all voltage differences across the terminals of all devices within current mirrors 204 and 206 and drivers 200 and 202 do not exceed a tolerance threshold. This is to allow the use of $V_{High}$ without damaging the devices in signal driving system 108.

In one embodiment, signal driving system 108 is a single ended current mode driver. Current mode driver 108 can either push or pull current through an output node 220 ( to produce output signal 112. Pushing current flow 222 is based on current flowing from second power supply 218 out of node 220. Pulling current flow 224 is based on current flowing from output node 220 to ground 216.

During operation, at least four states can occur.

In a first state, driver 200 is active and driver 202 in inactive. In this state, driver 200 outputs a signal 230 based on a received signal 232 (e.g, Input1, a digital signal). Signal 230 flows through first protection device 208 and is mirrored to second voltage supply 218 using first current mirror 204. A mirrored (and optionally scaled or multiplied) signal 234 flows through second protection device 210 and forms output signal 112 through node 220. Signal 230 can be swung up to $V_{High}$.

In a second state, driver 200 is inactive and driver 202 is active. In this state, driver 202 outputs a signal 240 based on received signal 242 (e.g., Input 2, a digital signal). Signal 240 is mirrored through second current mirror 206 and is fed to ground 216. The mirrored (and optionally scaled or multiplied) signal 224 flows from output node 220 to ground 216 through third protection device 212. Signal 230 can be swung down to GND.

In a third state, drivers 200 and 202 can both be inactive. In this state, signal driving system 108 can be configured to function as a HIGHZ driver. This can be accomplished by pulling Input 1 232 to ground 216 and pulling Input 2 242 to $V_{Low}$. When this occurs, no current will flow into or out of output node 220. Thus, while operating in a HIGHZ state, signal driving system 108 is in a high impedance state, which makes signal driving system 108 inactive.

In a fourth state, drivers 200 and 202 are both active, which also can be a HIGHZ state. However, this is a very inefficient state because there is no output even though both drivers 200 and 202 are producing current.

In an embodiment discussed above, when resistor R is coupled between node 220 and Vref from chip 102A, voltage 112 formed across resistor R is detected by a receiver (not shown) in transceiver 106 of chip 102B. In this configuration, if current is pushed out node 220 of chip 102A, voltage 112 is higher than Vref, and the receiver in chip 102B detects a high signal (e.g., representing a digital 1). Similarly, if the current is pulled in through node 220 of chip 102A, voltage 112 is lower than Vref, and the receiver in chip 102B detects a low signal (e.g., representing a digital 0).

In an alternative embodiment, for example a differential output environment, resistor R can be coupled between two pins of a differential output. In this embodiment, if one pin is higher than the other, the receiver in chip 102B detects a high signal (e.g., representing a digital 1), otherwise the receiver in chip 102B detects a low signal (e.g., representing a digital 0).

Exemplary Circuit for a Signal Driving System

Figure 3:
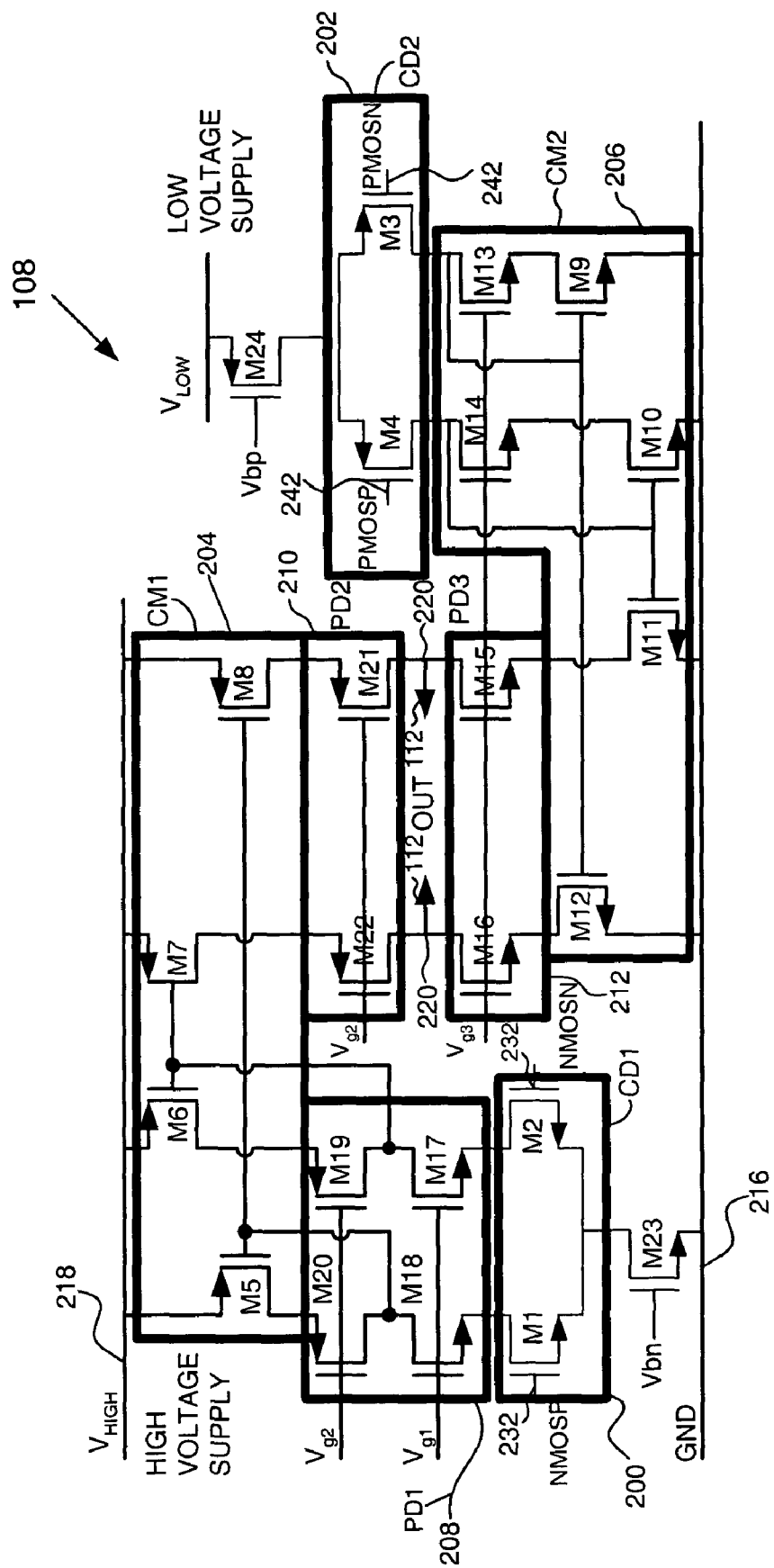
FIG. 3 is a schematic diagram of a differential signal driving system.

FIG. 3 is an exemplary schematic representation of differential driver 108 in FIG. 2. It is to be appreciated that many other circuit configurations and elements can be used to form the elements in driver 108, all of which are contemplated within the scope of the present invention.

First driver 200 includes transistors M1 and M2 (e.g., NMOS devices) and is biased using M23. A second driver 202 includes transistors M3 and M4 (e.g., PMOS devices) and is biased using M24. M is used to designate metal oxide semiconductor field effect transistors (MOSFETS) of either p-type or n-type. It is to be appreciated that, although only MOSFETS are shown, any type of transistors, or combinations thereof, can be used to form driver 108.

M1 and M2 receive complementary digital signals NMOS-P and NMOS-N 232 from digital signal system 104. Similarly, M3 and M4 receive complementary digital signals PMOS-P and PMOS-N 242 from digital signal system 104. M1, M2, M3, and M4 can be thin oxide transistors having relative low breakdown voltages, which can be rated at about 1.2 Volts. Being rated at 1.2 Volts allows M1, M2, M3, and M4 to be driven directly using signals 232 and 242 without requiring signals 232 and 234 to be level shifted using a level shifting system. Level shifting is usually required for thick oxide transistors having relative high breakdown voltages, for example about 2.5 Volt devices, because the digital driving system 104 typically uses only the lowest available supply voltage. Thus, through use of thin oxide devices having relatively low breakdown voltages, complexity within chip 102 is substantially reduced because a level shifting system is not required.

First current mirror 204 includes transistors M5, M6, M7, and M8 (e.g., PMOS transistors) and second current mirror 206 includes transistors M9, M10, M11, and M12 (e.g., NMOS transistors). Second current mirror 206 can also optionally include a protection device M13 and M14 (e.g., NMOS transistors). Although not necessary, when second current mirror 206 includes M13 and M14 they balance transistors M15 and M16 (e.g., NMOS transistors) in third protection device 212 which improves the performance of the second current mirror 206.

First protection device 208 includes two stacks of paired transistors M17/M18 (e.g., NMOS transistors) and M19/M20 (e.g., PMOS transistors).

Second protection device 210 includes a pair of transistors M21 and M22 (e.g., PMOS transistors).

All of these devices (elements 204, 206, 208, 210, and 212) can have thick oxide transistors with relative high breakdown voltages, which are rated for 2.5 Volts.

Figure 4:
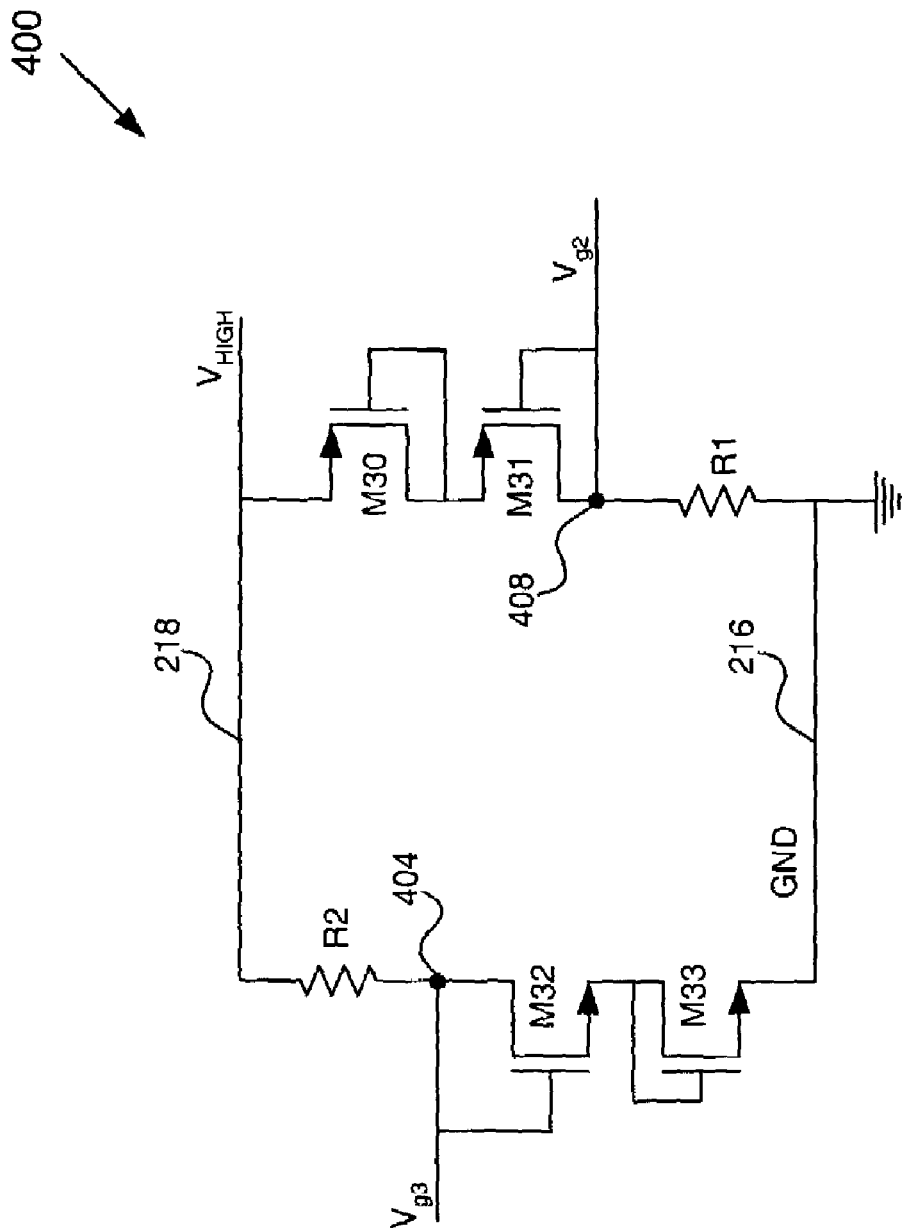
FIG. 4 is a schematic diagram of a voltage bias system used to bias certain devices in the signal driving system of FIG. 3.

FIG. 4 shows an exemplary bias circuit 400 for nodes Vg2 and Vg3 used in the protection devices. Bias Circuit 400 is coupled between $V_{High}$ and ground 216. Power supply 400 includes first and second transistors M30 and M31 (e.g., PMOS transistors) coupled in series with a first resistor R1. An output voltage Vg2 (e.g., about 2.5 Volts) is produced at an output node 402, which couples a gate and source of M31 and one end of resistor R1. The other end of resistor R1 is coupled to ground 216. Vg2 is received at gates of M19, M20, M21, and M22 (see FIG. 3).

Bias circuit 400 also includes third and fourth transistors M32 and M33 (e.g., NMOS transistors) coupled in series with a second resistor R2. Another output voltage Vg3 (e.g., about 1 Volt) is produced at an output node 404, which couples a gate and source of M32 and one end of resistor R2. The other end of resistor R2 is coupled to $V_{High}$. Vg3 is received at gates of M13, M14, M15, and M16 (see FIG. 3).

Although not shown in FIG. 4, Vg1 is received at gates of M17 and M18, and can be about 1.2 Volts.

Exemplary Applications of the Signal Driving System

In another embodiment, a rise and fall time of output signal 112 through node 220 can be set by design parameters. This can be based on controlling the ratio of current mirrors 204 and 206, which is accomplished through controlling the width (W) to length (L) ratios of their transistors M5/M6/M7/M8 and M9/M10/M11/M12, respectively. The rise and fall times are very important in IEEE 1394 devices. Thus, if signal driving system 108 is used in an IEEE 1394 system, rise and fall times of output signals 112 can be set within the required limits.

Through use of protection devices 208, 210, and 212, driver 108 can operate in a high voltage current mode in a low voltage process without damaging current mirrors 204 and 206 and drivers 200 and 202. Thus, an output voltage at node 220 can swing between GND (e.g. 0 Volts) and $V_{High}$ (e.g. 3.3 Volts) without damaging devices within current mirrors 204 and 206 and drivers 200 and 202.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A signal driving system, comprising:
a first driver coupled to a first voltage supply,;
a first current mirror coupled to a second voltage supply, the second voltage supply having a higher voltage value than the first voltage supply, the first driver configured to push a signal through the first current mirror to an output node;
a first protection device coupled between the first driver and the current mirror;
a second protection device coupled between the current mirror and the output node;
a second current mirror coupled to ground;
a third protection device coupled between the output node and the second current mirror; and
a second driver coupled to a third voltage supply and to the second current mirror, the second driver configured to pull a signal from the output node.

2. The signal driving system of claim 1, wherein the first driver pushes the output signal from the first driver, through the first protection circuit, the first current mirror, the second protection circuit, and out the output node.

3. The signal driving system of claim 1, wherein the first voltage supply is substantially equal to the third voltage supply.

4. The signal driving system of claim 1, wherein the second driver pulls the output signal from the output node, through the third protection device, through the second current mirror, and to ground.

5. The signal driving system of claim 1, wherein the first and second protection devices are configured to maintain signals inside the first current mirror and first driver from crossing a threshold.

6. The signal driving system of claim 1, wherein the first voltage supply is approximately 1.2 Volts.

7. The signal driving system of claim 1, wherein the first voltage supply is approximately 2.5 Volts.

8. The signal driving system of claim 1, wherein the second voltage supply is approximately 3.3 Volts.

9. The signal driving system of claim 1, wherein the first driver comprises thin-oxide transistors having relatively low breakdown voltages.

10. The signal driving system of claim 1, wherein first driver comprises thin-oxide field effect transistors having relatively low breakdown voltages.

11. The signal driving system of claim 1, wherein first driver comprises thin-oxide n-type field effect transistors having relatively low breakdown voltages.

12. The signal driving system of claim 1, wherein the second driver comprises thin-oxide transistors having relatively low breakdown voltages.

13. The signal driving system of claim 1, wherein second driver comprises thin-oxide field effect transistors having relatively low breakdown voltages.

14. The signal driving system of claim 1, wherein second driver comprises thin-oxide p-type field effect transistors.

15. The signal driving system of claim 1, wherein the first, second, and third protection devices comprise thick-oxide transistors having relatively high breakdown voltages.

16. The signal driving system of claim 1, wherein the first, second, and third protection devices comprise thick-oxide field effect transistors having relatively high breakdown voltages.

17. The signal driving system of claim 1, wherein the first protection device comprises:
a pair of thick-oxide n-type field effect transistors having relatively high breakdown voltages; and
a pair of thick-oxide p-type field effect transistors having relatively high breakdown voltages.

18. The signal driving system of claim 1, wherein the second protection device comprises:

a pair of thick-oxide p-type field effect transistors having relatively high breakdown voltages.

19. The signal driving system of claim 1, wherein the third protection device comprises:
a pair of thick-oxide n-type field effect transistors having relatively high breakdown voltages.

20. The signal driving system of claim 1, wherein the first and second current mirrors comprise thick-oxide transistors.

21. The signal driving system of claim 1, wherein the first and second current mirrors comprise thick-oxide field effect transistors having relatively high breakdown voltages.

22. The signal driving system of claim 1, wherein the first and second drivers receive digital signals and output analog signals.

23. The signal driving system of claim 1, wherein the output analog signals comprise one of voltages and currents.

24. The signal driving system of claim 1, wherein the first and second drivers comprises current drivers.

25. The signal driving system of claim 1, further comprising at least a third voltage supply coupled to the first and second protection devices.

26. The signal driving system of claim 25, wherein the third voltage supply has a value of about 2.5 Volts.

27. The signal driving system of claim 1, further comprising a fourth voltage supply coupled to the second current mirror and the third protection device.

28. The signal driving system of claim 27, wherein the fourth voltage supply has a value of about 1 Volt.

29. The signal driving system of claim 1, wherein the signal driving system is configured to operate as a HIGHZ driver when one or more inputs of the first driver are pulled to ground and one or more inputs of the second driver are pulled to the third voltage supply.

30. The signal driving system of claim 1, wherein:
the first current mirror has a first current mirror ratio; and
the second current mirror has a second current mirror ratio, such that the first and second current mirror ratios control a rise and fall time of the signal flowing through the output node.

31. The signal driving system of claim 30, wherein the first and second current mirrors comprise first and second sets of transistors and the first and second current mirror ratios are based on a width to length ratio of the first and second transistors, respectively.

32. The signal driving system of claim 22, wherein:
the received digital signals are complementary digital signals; and
the output analog signals are differential analog signals.

* * * * *

UNITED STATES PATENT AND TRADEMARK OFFICE
CERTIFICATE OF CORRECTION

PATENT NO. : 7,161,781 B2  
APPLICATION NO. : 10/660662  
DATED : January 9, 2007  
INVENTOR(S) : van Engelen et al.

Page 1 of 1

It is certified that error appears in the above-identified patent and that said Letters Patent is hereby corrected as shown below:

<u>Column 5</u>  
Line 65 please replace "voltage supply,;" with --voltage supply;--.

Signed and Sealed this

Third Day of April, 2007

JON W. DUDAS  
*Director of the United States Patent and Trademark Office*